United States Patent
Chiu et al.

(10) Patent No.: US 9,489,480 B1
(45) Date of Patent: Nov. 8, 2016

(54) TECHNIQUES FOR COMPILING AND GENERATING A PERFORMANCE ANALYSIS FOR AN INTEGRATED CIRCUIT DESIGN

(71) Applicant: Altera Corporation, San Jose, CA (US)

(72) Inventors: Gordon Raymond Chiu, North York (CA); Benjamin Gamsa, Toronto (CA); Paul Mark Leventis, Toronto (CA)

(73) Assignee: Altera Corporation, San Jose, CA (US)

( * ) Notice: Subject to any disclaimer, the term of this patent is extended or adjusted under 35 U.S.C. 154(b) by 219 days.

(21) Appl. No.: 14/295,752

(22) Filed: Jun. 4, 2014

(51) Int. Cl.
*G06F 17/50* (2006.01)

(52) U.S. Cl.
CPC ......... *G06F 17/5081* (2013.01); *G06F 17/505* (2013.01); *G06F 17/5009* (2013.01)

(58) Field of Classification Search
None
See application file for complete search history.

(56) References Cited

U.S. PATENT DOCUMENTS

| | | | |
|---|---|---|---|
| 7,134,096 B2 * | 11/2006 | Brathwaite | G06F 17/50 700/121 |
| 7,506,277 B1 * | 3/2009 | Arora | G06F 17/5081 716/122 |
| 7,523,429 B2 * | 4/2009 | Kroyan | G06F 17/5068 716/119 |
| 7,770,140 B2 | 8/2010 | Bell et al. | |
| 8,122,399 B2 * | 2/2012 | Bowers | G06F 17/505 716/104 |
| 8,176,445 B1 * | 5/2012 | Qian | G06F 17/5068 716/122 |
| 8,185,862 B2 * | 5/2012 | Durbha | G06F 17/5068 716/109 |
| 8,234,610 B2 * | 7/2012 | Harashima | G06F 17/5081 706/47 |
| 8,245,163 B1 * | 8/2012 | Yuan | G06F 17/5054 716/104 |
| 8,407,643 B1 | 3/2013 | Atsatt | |
| 8,407,653 B1 | 3/2013 | Schumacher et al. | |
| 8,443,322 B2 * | 5/2013 | Strenski | G06F 17/5068 716/119 |
| 8,661,379 B1 | 2/2014 | Atsatt | |
| 8,661,402 B2 | 2/2014 | Bhushan et al. | |
| 8,949,203 B1 * | 2/2015 | O'Riordan | G06F 17/5081 707/694 |

* cited by examiner

*Primary Examiner* — Leigh Garbowski

(57) ABSTRACT

Techniques for compiling an integrated circuit (IC) design with an electronic design automation (EDA) tool are provided. The IC design may be compiled for different IC devices. When the IC design is compiled for a selected integrated circuit device, the EDA tool may analyze the IC design to determine whether the design is compatible with the selected IC device. If the IC design contains elements that are incompatible with the selected IC device, the EDA tool may compile the design based on a simulated removal of the incompatible elements. In some instances, the EDA tool may identify optimization opportunities in the IC design and may compile the design based on an optimized version of the IC design. The EDA tool may generate a compilation output (e.g., a performance analysis report) based on the simulated removal of the incompatible elements (or the optimized version of the IC design.

18 Claims, 7 Drawing Sheets

TECHNIQUES FOR COMPILING AND GENERATING A PERFORMANCE ANALYSIS FOR AN INTEGRATED CIRCUIT DESIGN

BACKGROUND

Integrated circuit (IC) designers generally use an electronic design automation (EDA) or computer-aided design (CAD) tool to create IC designs. The designs may then be compiled using the EDA tool to generate configuration images or configuration bit files that are subsequently loaded onto actual IC devices. Thus, when creating an IC design, a circuit designer may generally target the design to a particular IC device.

As an example, an IC design may require certain resources and may be adapted to perform specific functions. As such, in order for the IC design to be compiled, the user or circuit designer may need to target the IC design to a specific device. The EDA tool may then compile the design based on the requirements of the design and the actual resources available on that particular device. As a result, it may not generally be feasible to compile an IC design that has been adapted or targeted to a particular IC device for a different device without making changes to the IC design.

When an IC design is compiled for a different IC device than the one that it was originally designed for, the compilation may fail. This generally means that the circuit designer may not be able to estimate the performance of their design on a different IC device without extensive modifications to their design. The inability to assess the performance of an IC design on a different device (or more specifically, a newer device) that the design was targeted for may lead to slower adoption of newer technology.

It is within this context that the embodiments described herein arise.

SUMMARY

Techniques for generating a performance analysis for an integrated circuit (IC) design are provided. Embodiments of the present invention include methods to analyze the performance of a circuit design on different IC devices without making extensive changes to the design.

It is appreciated that the present invention can be implemented in numerous ways, such as a process, an apparatus, a system, a device or a computer readable medium. Several inventive embodiments of the present invention are described below.

A method of compiling an IC design for a selected IC device with an electronic design automation (EDA) tool is provided. A step in the method includes determining whether the IC design is compatible with a set of predefined rules associated with the selected IC device. The predefined rules may be determined by the EDA tool, depending on the selected IC device. As an example, the EDA tool may determine the types or number of resources available on the selected IC device and may accordingly analyze the IC design based on the available resources.

If, for instance, a required resource in the IC design is not available on the selected IC device, the EDA tool may consider the IC design as incompatible with the selected IC device. When an IC design is determined to be incompatible with the set of predefined rules that is associated with the selected IC device, the EDA tool may compile the IC design based on a simulated removal of the identified incompatibility factor. The EDA tool may accordingly generate an output of the compilation based on the simulated removal of the incompatibility factor.

A method for analyzing an IC design for a selected IC device with an EDA tool includes identifying at least one optimization opportunity in the IC design. The EDA tool may identify areas or circuitry in the IC design that may be optimized for better performance (e.g., to run at a higher speed, etc.). When an optimization opportunity is identified, the EDA tool compiles the IC design based on an optimized version of the IC design. In one scenario, the EDA tool may not make any actual changes to the IC design, but will compile the IC design with the assumption that the IC design has been optimized. The EDA tool accordingly generates a performance analysis output for the selected IC device based on the optimized version of the IC design.

Another method for analyzing an IC design with an EDA tool includes identifying an incompatibility factor between an IC design and a selected IC device. In one scenario, the IC design may first be compiled for a target IC device that is different from the selected device before being migrated to the selected IC device. The EDA tool may then identify the incompatibility factor in the migrated IC design. For example, a required resource in the IC design that is unavailable on the IC device that the design is migrated to may be identified as an incompatibility factor. When the incompatibility factor is identified, the EDA tool may compile the migrated IC design based on a simulated removal of the incompatibility factor. As an example, when a required resource is unavailable on the IC device, the required resource is assumed to be removed from the IC design, without actually making any modifications to the IC design, and the migrated IC design is compiled based on that assumption.

DETAILED DESCRIPTION

The embodiments provided herein include techniques to produce a performance analysis or performance estimation of an integrated circuit (IC) design when implemented on different IC devices.

It will be obvious, however, to one skilled in the art, that the present exemplary embodiments may be practiced without some or all of these specific details. In other instances, well-known operations have not been described in detail in order not to unnecessarily obscure the present embodiments.

Figure 1:
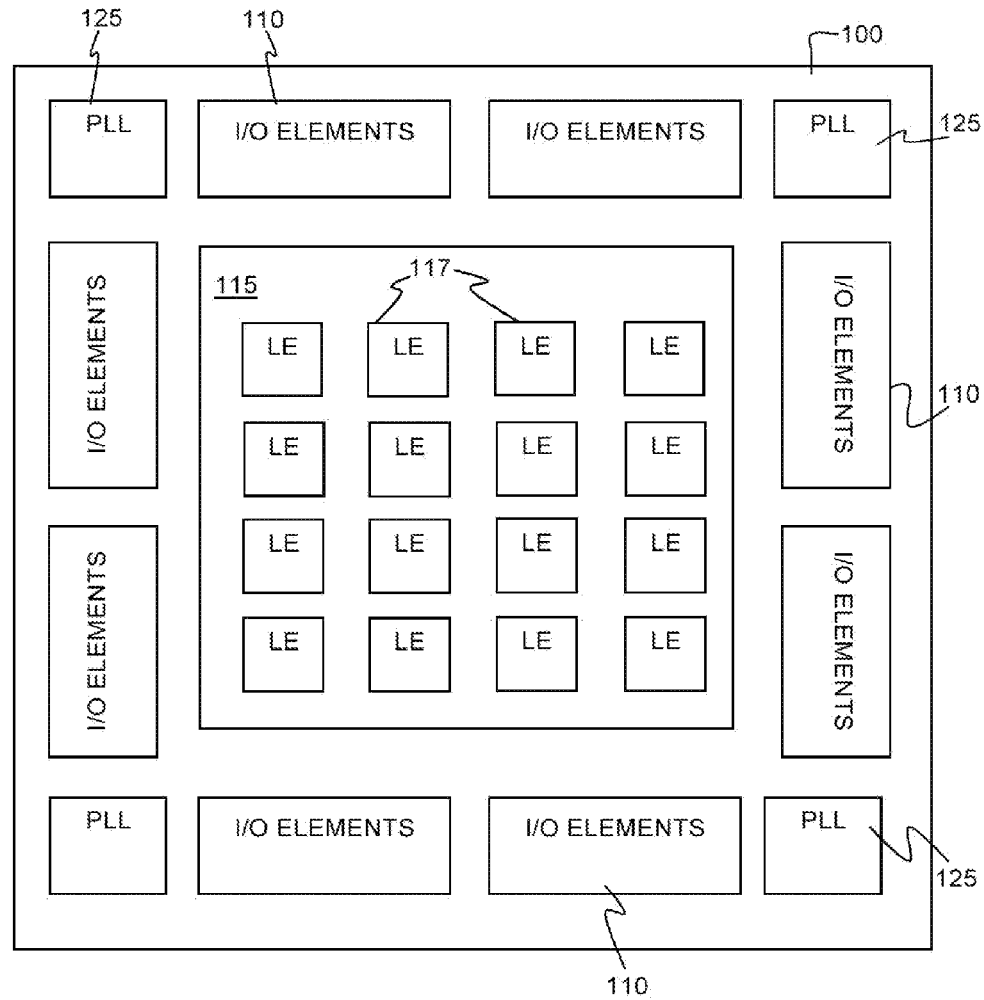
FIG. 1 is a simplified block diagram of an integrated circuit in accordance with embodiments of the present invention.

An IC device such as a field-programmable gate array (FPGA) device, generally includes, among others, memory modules, logic blocks, clock generation circuitry, and input-output elements. FIG. 1, meant to be illustrative and not limiting, shows a simplified block diagram of IC 100. IC 100 includes core logic region 115 and input-output elements 110. Other auxiliary circuits, such as phase-locked loops (PLLs) 125, for clock generation and timing, can be located outside core logic region 115 (e.g., at corners of IC 100 and adjacent to input-output elements 110).

Signals received from external circuitry at input-output elements 110 may be routed from input-output elements 110 to core logic region 115 or other logic blocks (not shown) on IC 100. Accordingly, signals may be sent from core logic region 115 and other relevant logic blocks of IC 100 to other external circuitry or components that may be connected to IC 100 through input-output elements 110. It should be noted that a single device like IC 100 can potentially support a variety of different interfaces and each individual input-output bank 110 may support a different input-output standard with a different interface or a different voltage level.

Core logic region 115 may be populated with logic cells that may include "logic elements" (LEs) 117, among other circuits. In one embodiment, LEs 117 may include look-up table-based logic regions and may be grouped into "Logic Array Blocks" (LABs). LEs 117 and groups of LEs or LABs may be configured to perform specific user functions. Configuration data loaded into configuration memory (not shown) may be used to produce control signals that configure LEs 117 and groups of LEs and LABs to perform the desired user functions.

As an example, a circuit designer may design a circuit that performs specific logic functions. Typically, a circuit designer may use an electronic design automation (EDA) tool when designing a circuit. The process of designing a circuit to be implemented on an IC device such as IC 100 may be done in several steps with a typical EDA tool. The EDA tool may accordingly produce an output file (e.g., a configuration file) that is then used to configure the IC device with the user design. Accordingly, core logic region 115 may further include random access memory elements, such as static random access memory (SRAM) cells, configuration RAM (CRAM) and look-up table RAM (LUTRAM) cells (not shown in FIG. 1), that may be used to hold configuration data. For instance, configuration data (from the configuration file) loaded into configuration memory on IC 100 may be used to produce control signals that configure any of the LEs 117 and groups of LEs and LABs to perform desired logical functions.

Figure 2:
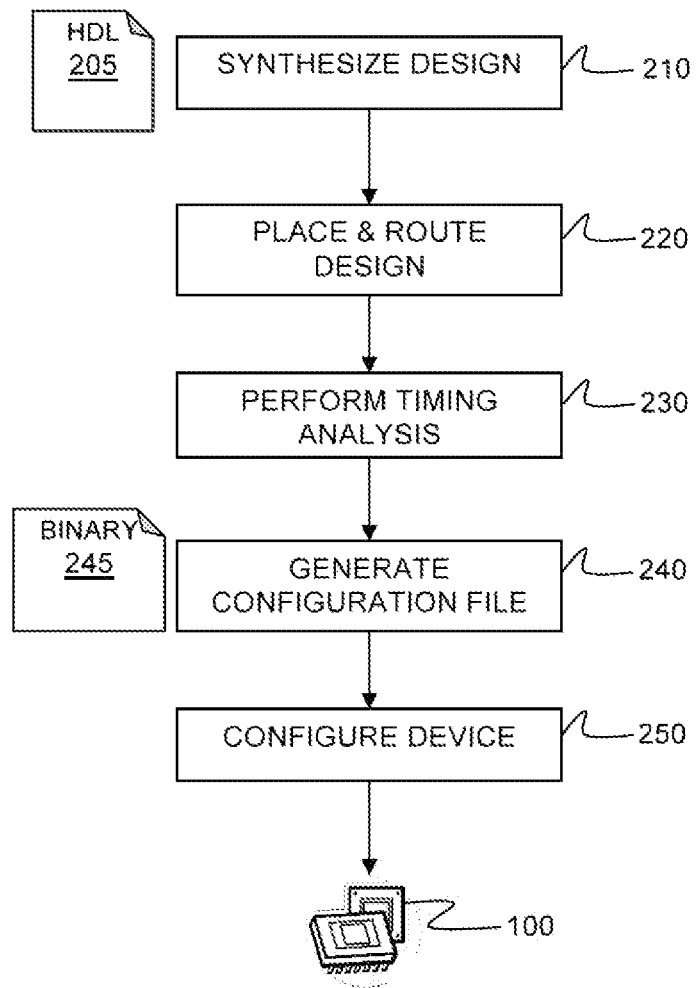
FIG. 2 depicts an illustrative diagram of a method to create and compile a circuit design for an integrated circuit using an electronic design assistant (EDA) tool in accordance with embodiments of the present invention.

FIG. 2 depicts illustrative steps for compiling a circuit design for an IC device using an EDA tool in accordance with embodiments of the present invention. Generally, a circuit designer or engineer may create a circuit design that is embodied in a hardware description language (HDL) file 205. It should be noted that even though HDL file 205 is shown in FIG. 2, other design input techniques (e.g., input files using other high-level languages, the Open Computing Language (OpenCL) framework, or compilation output based on various models, etc.) may be applicable in this context. The circuit design may be created using the EDA tool or may be provided by the user as an input to the EDA tool. At step 210, HDL file 205 may be synthesized by the EDA tool. For instance, the synthesis operation performed at step 210 may translate the circuit design embodied in HDL file 205 into a discrete netlist of logic-gate primitives. The synthesized logic gates in the circuit design are then placed and routed on a target IC device at step 220.

After the place and route operation, at step 230, a timing analysis tool (e.g., the EDA tool may include a built-in timing analyzer) may perform a timing analysis operation on the circuit design. It should be appreciated that the timing analysis operation may compute the lengths of different paths in the circuit design and the timing constraints of the overall circuit design. The EDA tool may then generate binary configuration file 245 at step 240. Binary configuration file 245 contains description of the circuit design and may be used to configure or program the targeted IC device (e.g., contents of binary configuration file is loaded onto IC device 100) at step 260. Alternatively, binary configuration file 245 may contain description to produce IC masks that can then be used to fabricate the targeted IC device.

Generally, the compilation process as depicted in FIG. 2 may fail when the circuit design is compiled for a device that is different from the targeted IC device. For example, before the circuit designer initiates the compilation process, the circuit designer may select the targeted IC device from a list of available IC devices in the EDA tool. If, at a later time, the circuit designer would like to select a different IC device and compile the circuit design for that selected IC device, the compilation process may fail if the selected IC device is incompatible with the existing circuit design. In one scenario, the selected IC device may not include resources that are used in the circuit design or the selected IC device may have a different architecture that is incompatible with the existing circuit design. In this scenario, without the ability to compile the circuit design for a different IC device, the circuit designer may not be able to assess the performance of the circuit design on an IC device that the circuit design is not targeted for.

As an example, the circuit designer may design a circuit for a targeted IC device and at a later time, may want to implement the same design on a newer IC device. In order to ensure that the circuit design works on the newer IC device, the circuit design needs to first be compiled for that IC device. However, the circuit designer generally needs to make modifications to the circuit design in order to compile the design for a different IC device. Even if the circuit designer may not necessarily need a valid configuration bitstream from the compilation, the circuit designer may still need to make extensive modifications to their design in order to obtain a proper performance assessment on the performance of the circuit design on a different or newer IC device.

In order to enable the user or circuit designer to easily assess the performance of their circuit design on a different or newer IC device, a "permissive compilation" may be performed. In one scenario, the "permissive compilation" process mimics a general circuit design compilation process as that highlighted in FIG. 2, but may ignore certain incompatibilities in the circuit design during compilation. As an example, when the circuit designer performs a "permissive compilation" with the EDA tool, the EDA tool may ignore certain incompatibilities in the circuit design by assuming specific changes would be made to the circuit design. This allows the circuit design to be compiled for any IC device. Even though the compiled circuit design may not generate a functional configuration bitstream for that IC device, the EDA tool may generate a list of incompatibilities in the circuit design and a performance estimate for the circuit design. This may enable the circuit designer to make a better decision in when deciding whether or not to convert or migrate a particular circuit design to a different (often newer) IC device.

Figure 3:
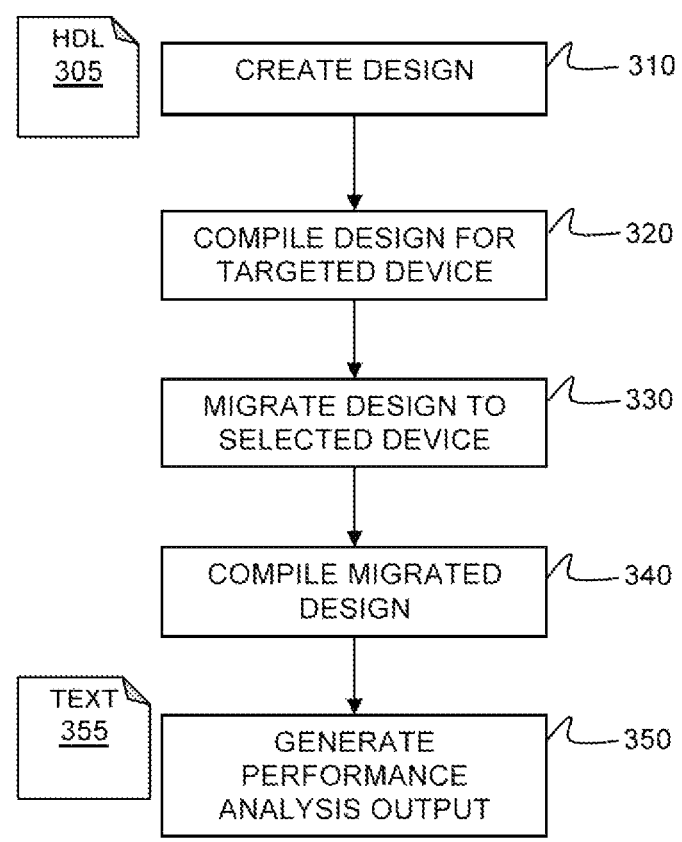
FIG. 3 shows illustrative steps for compiling an IC design for a targeted integrated circuit device and migrating the integrated design to a different device to obtain a performance analysis for the integrated circuit design in accordance with one embodiment of the present invention.

FIG. 3 shows illustrative steps for compiling an IC design for a targeted IC device and migrating the integrated design to a different device to obtain a performance analysis for the IC design in accordance with one embodiment of the present invention. At step 310, a user or circuit designer may create a circuit design that is embodied in HDL file 305 with an EDA tool. The user may then initiate a compilation process and the EDA tool may compile the circuit design for a targeted design at step 320. In one example, the compilation process may include a portion or all of the steps shown in FIG. 2. At step 330, the user may select another IC device and the EDA tool may migrate (or convert and adapt) the circuit design to the newly selected IC device.

In one embodiment, the user may not perform any modifications to the circuit design at this stage. The EDA tool then compiles the migrated design at step 340. In one embodiment, in the course of the compilation of the migrated design at step 340, the EDA tool may identify incompatibilities (if any) in the circuit design with the selected IC device. The EDA tool may also identify optimization opportunities for the circuit design based on the resources available in the selected IC device. If there are incompatibilities in the circuit design, the EDA tool may record the incompatibilities and may continue the compilation process with the assumption that the incompatibilities have been removed.

If optimization opportunities are identified, the EDA tool may compile the circuit design and analyze the design (e.g., by performing timing analysis on the design) based on the assumption that the circuit design has been optimized. The EDA tool may generate a performance analysis output in the form of text output file 355 at step 350 based on the compilation of the migrated circuit design. In one embodiment, the text output file 355 may contain a list of incompatibility factors and optimization opportunities identified in the circuit design. The text output file 355 may also contain a report of the performance of the circuit design on the selected IC device (i.e., the IC device that the circuit design is migrated to). It should be appreciated that even though text output file 355 is shown in the embodiment of FIG. 3, other output formats may be applicable in this context. In some instances, the EDA tool may generate a text-based interactive report, a graphical representation, or a set of proposed changes (e.g., HDL changes) via a graphical user interface (GUI).

Figure 4:
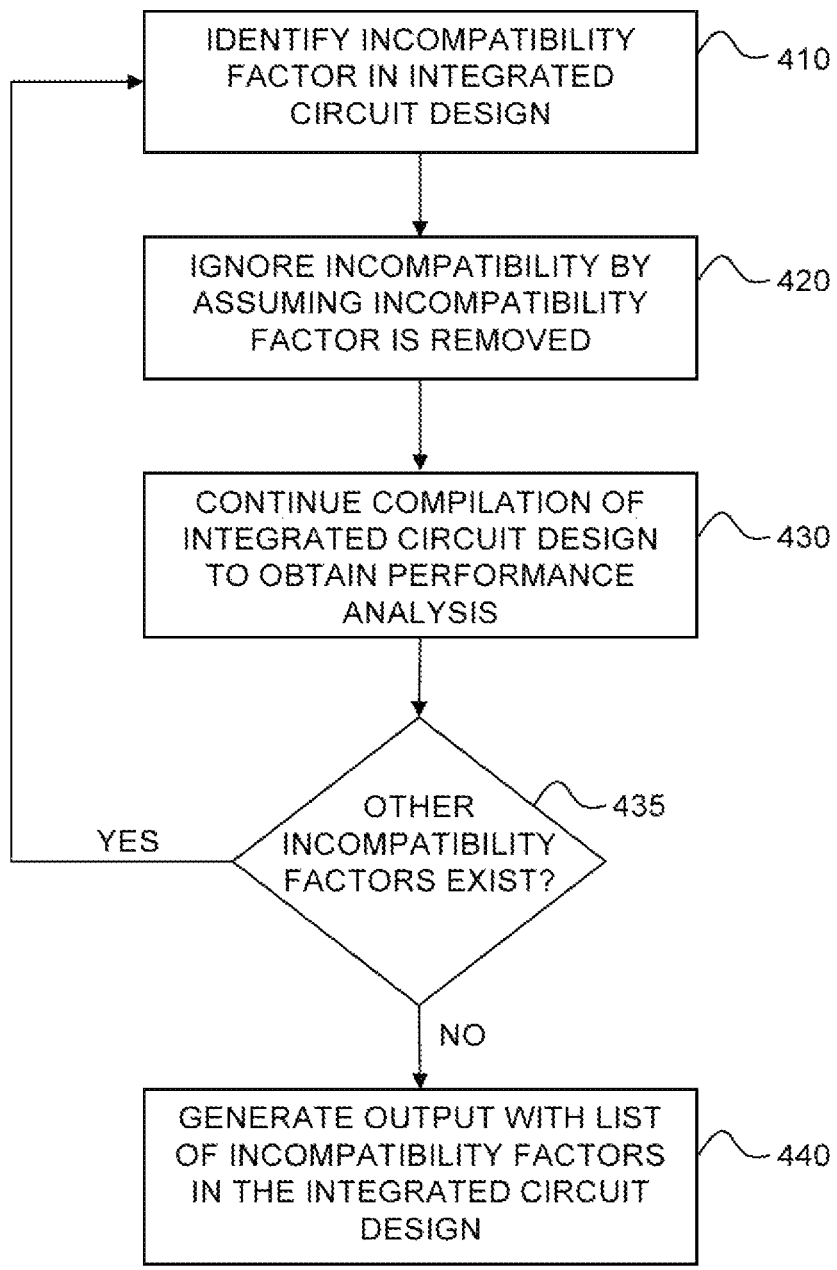
FIG. 4 shows illustrative steps performed by an EDA tool when compiling and analyzing a circuit design for incompatibility factors in accordance with embodiments of the present invention.

FIG. 4 shows illustrative steps performed by an EDA tool when compiling and analyzing a circuit design for incompatibility factors in accordance with embodiments of the present invention. In one scenario, the steps shown in FIG. 4 may be performed as part of a circuit design compilation process (e.g., steps 340 and 350 of FIG. 3). At step 410, the EDA tool may identify an incompatibility factor in the circuit design. For example, the resources used or required by the circuit design may be compared with the available resources in a selected IC device. In this instance, resources that are required in the circuit design but are not available in the IC device may be flagged as incompatibility factors between the circuit design and the IC device.

At step 420, the EDA may ignore the incompatibility factor by assuming that the incompatibility factor (if any) has been removed. In one scenario, if the circuit design requires a specific resource that is not available in the selected IC device, the EDA tool may assume that that particular resource has been removed from the circuit design or replaced with an available resource (even though the circuit design has not been modified or updated). In one embodiment, the EDA tool may perform a simulated removal of the required resource from the circuit design if that resource is not available in the selected IC device.

In some instances, available resources may be incompatible with the required resource. For example, the circuit design may require a memory module with a specific width or mode that does not fit any memory module in the selected IC device, or the circuit design may use a register with an asynchronous clear terminal while the selected IC device only has registers with synchronous clear terminals. When that happens, the EDA tool may either assume the affected resource is modified or replaced in the circuit design (e.g., the memory module is switched to a different mode, the memory module is replaced with another memory module with a different bus width, etc.) Accordingly, in one embodiment, any incompatibility factor that may halt compilation is assumed to be resolved by the EDA tool.

At step 430, the EDA tool continues compilation of the circuit design to obtain a performance analysis of the circuit design on the selected IC device. The performance analysis may be determined based on the assumption that any incompatibility factor in the circuit design has been (or will be) removed. For example, instead of waiting for the user or circuit designer to modify the circuit design (e.g., by removing the incompatibility factor and converting a terminal from one more to another), the EDA tool may ignore any incompatibility factors that exist in the circuit design. Therefore, instead of terminating compilation when an incompatibility factor is identified, the EDA tool may still be able to compile the circuit design.

In one scenario, as the EDA tool continues compilation of the circuit design, the EDA tool may determine if other incompatibility factors exist in the circuit design at step 435. If there are other incompatibility factors, the EDA tool may return to step 410 to identify each remaining incompatibility factor in the circuit design. Accordingly, steps 410, 420, and 430 may be repeated until all incompatibility factors in the circuit design are identified before a performance analysis that may include the list of identified incompatibility factors in the circuit design is generated. As shown in FIG. 4, at step 440, the EDA tool may generate an output with a list of all identified incompatibility factors between the circuit design and the selected IC device. For example, as mentioned above, if the circuit design includes a memory module (or any other circuit elements) that is not available in or supported by the selected IC device, that memory module may be listed as an identified incompatibility factor in the generated output.

Figure 5:
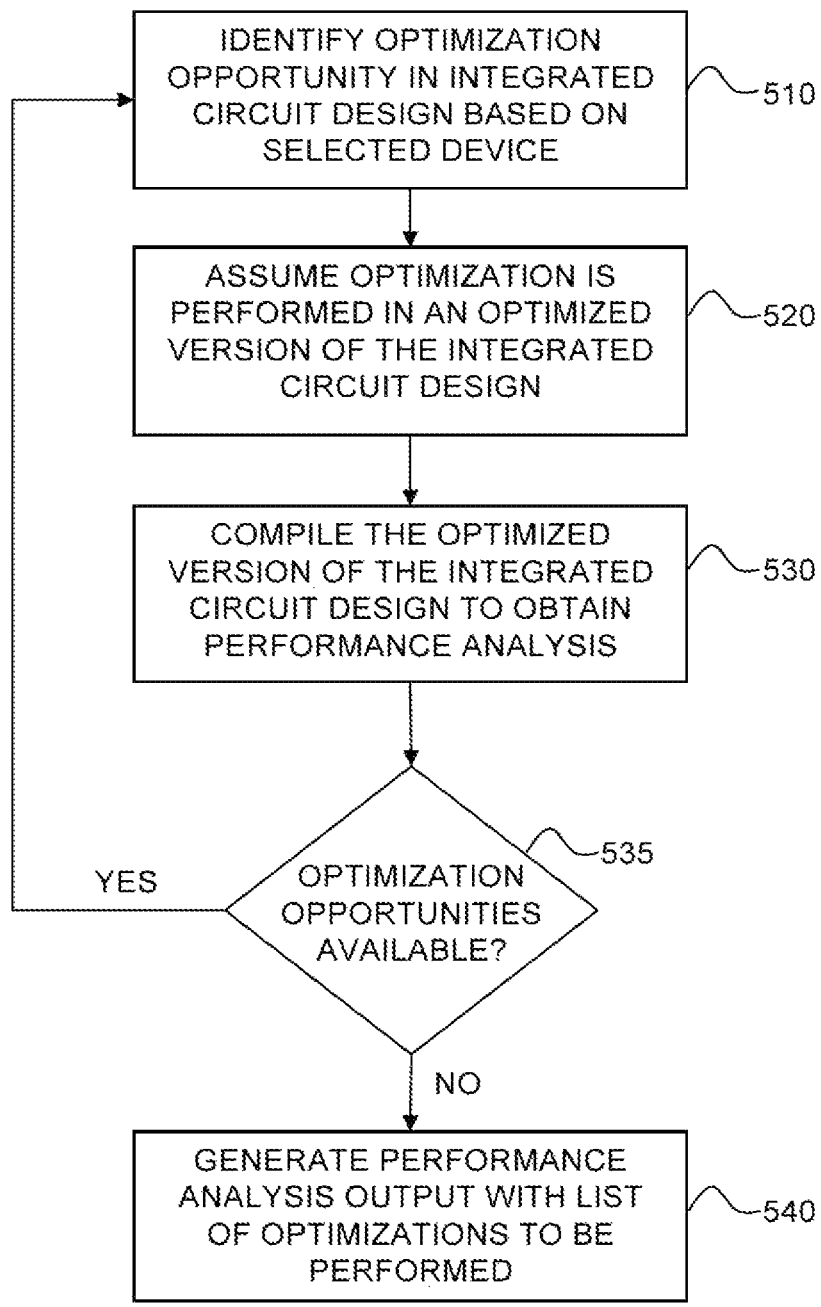
FIG. 5 shows illustrative steps performed by an EDA tool when compiling a circuit design for a selected integrated circuit device in accordance with one embodiment of the present invention.

FIG. 5 shows illustrative steps performed by an EDA tool when compiling a circuit design for a selected IC device in accordance with one embodiment of the present invention. It should be noted that the steps shown in FIG. 5 may be performed as part of a circuit design compilation process (e.g., steps 340 and 350 of FIG. 3). In one scenario, the steps shown in FIG. 5 may be performed as part of a circuit design compilation process in conjunction with the steps shown in FIG. 4. At step 510, the EDA tool may identify an optimization opportunity in the circuit design based on the selected IC device. For example, an asynchronous clear terminal in the circuit design may limit performance of the selected IC device. In order to improve or optimize the performance of the selected IC device, the EDA tool may convert the asynchronous clear terminal to a synchronous clear terminal to allow retiming of the design. In other instances, the selected circuit design may not have registers with an asynchronous clear terminal. It should be noted that even though specific examples are provided herein, other optimization opportunities may be identified based on different availability of resources between the selected device and the original target device of the circuit design.

Instead of halting compilation or forcing the user (circuit designer) to select a different IC device, the EDA tool may assume that the asynchronous clear terminal in the circuit design has been (or will be) converted to a synchronous clear terminal. Other optimization possibilities may include removing selected register terminals (e.g., clock enable and synchronous clear terminals) to retime the affected registers, and inserting additional pipeline register stages to improve performance of the selected IC device. In some other instances, when the EDA tool encounters certain design ambiguities, such as a performance limiting loop in the design, the EDA tool may simply record that as an area for optimization and assume that the design will be updated accordingly (e.g., the performance limiting loop may be broken, etc.). In one embodiment, these optimizations (e.g., the conversion of the terminal from one type to another, removal of certain terminals, addition of pipeline stages, etc.) are identified and assumed to be performed without changing the actual circuit design file that is provided by the user. As shown in FIG. 5, at step 520, the EDA tool assumes an optimization process is performed in an optimized version of the circuit design based on the identified optimization opportunity at step 510.

The EDA tool compiles the optimized version of the integrated circuit design to obtain a performance analysis at step 530. At step 535, the EDA tool may determine if other optimization opportunities exist in the circuit design. If other optimization opportunities exist, the EDA tool may return to step 510 to identify another optimization opportunity in the circuit design. Accordingly, steps 510, 520, and 530 may be repeated until all optimization opportunities in the circuit design are identified. After all the optimization opportunities have been identified, a performance analysis output that includes a list of optimizations to be performed is generated by the EDA tool at step 540. In the example above, the conversion of the asynchronous clear terminal to a synchronous clear terminal may be listed as an optimization step in the performance analysis output. Any gain that can possibly be obtained by performing such an operation (in this particular example, converting the asynchronous clear terminal to a synchronous one) may be estimated and recorded in the performance analysis output.

Figure 6:
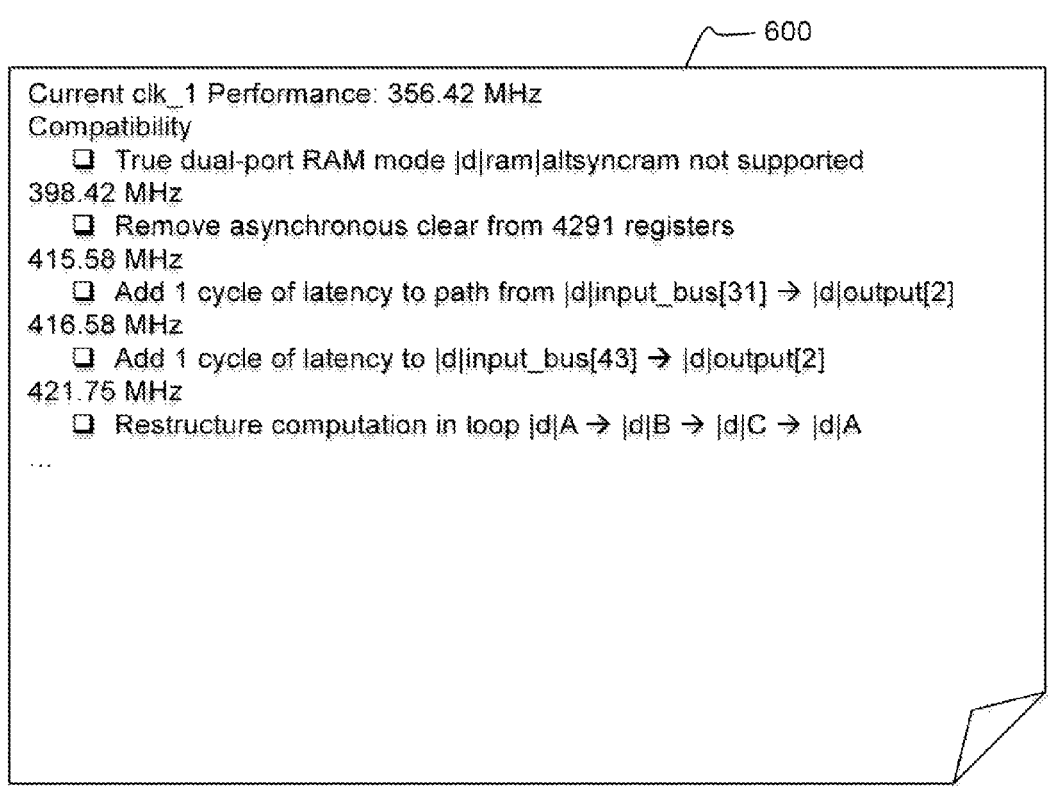
FIG. 6 shows an illustrative performance analysis output text file in accordance with one embodiment of the present invention.

It should be noted that such an output may be generated in the form of a text file or provided as a table as part of the GUI of the EDA tool. FIG. 6 shows an illustrative performance analysis output text file in accordance with one embodiment of the present invention. As mentioned and explained with reference to FIGS. 4 and 5, incompatibility factors or optimization opportunities that are identified in a circuit design may be listed and generated by the EDA tool as part of its performance analysis output. In the example of FIG. 6, performance analysis output text file 600 shows a maximum clock speed for the provided circuit design and the maximum clock speeds that the circuit design can achieve if various recommended changes were performed.

As an example, in the embodiment of FIG. 6, true dual-port random access memory (RAM) mode is not supported by the selected device (assuming the circuit design uses a true dual-port RAM), and the circuit designer needs to update the design to a different mode (e.g., single-port RAM mode). As another example, the maximum clock speed for the current circuit design is 356.42 megahertz (MHz), and if the circuit designer updates the design by removing asynchronous clear terminals from 4291 registers, the maximum achievable clock speed may be increased to 398.42 MHz.

Other example suggestions provided in the example of FIG. 6 include adding a latency to two different paths that will increase the maximum clock speed to 415.58 MHz and 416.58 MHz, respectively. An existing circuit loop in the circuit design may be restructured to further increase the performance of the selected device, and so on. It should be appreciated that these are merely examples of some of the possible items that may be listed in a performance analysis output provided by an EDA tool. Actual output may vary based on the circuit design provided and/or the selected IC device. Accordingly, the specific values shown in FIG. 6 (e.g., clock speeds, number of registers, names of ports, etc.) are merely examples to illustrate a possible output format for a possible scenario and are not meant to limit the embodiments described herein in any way.

Figure 7:
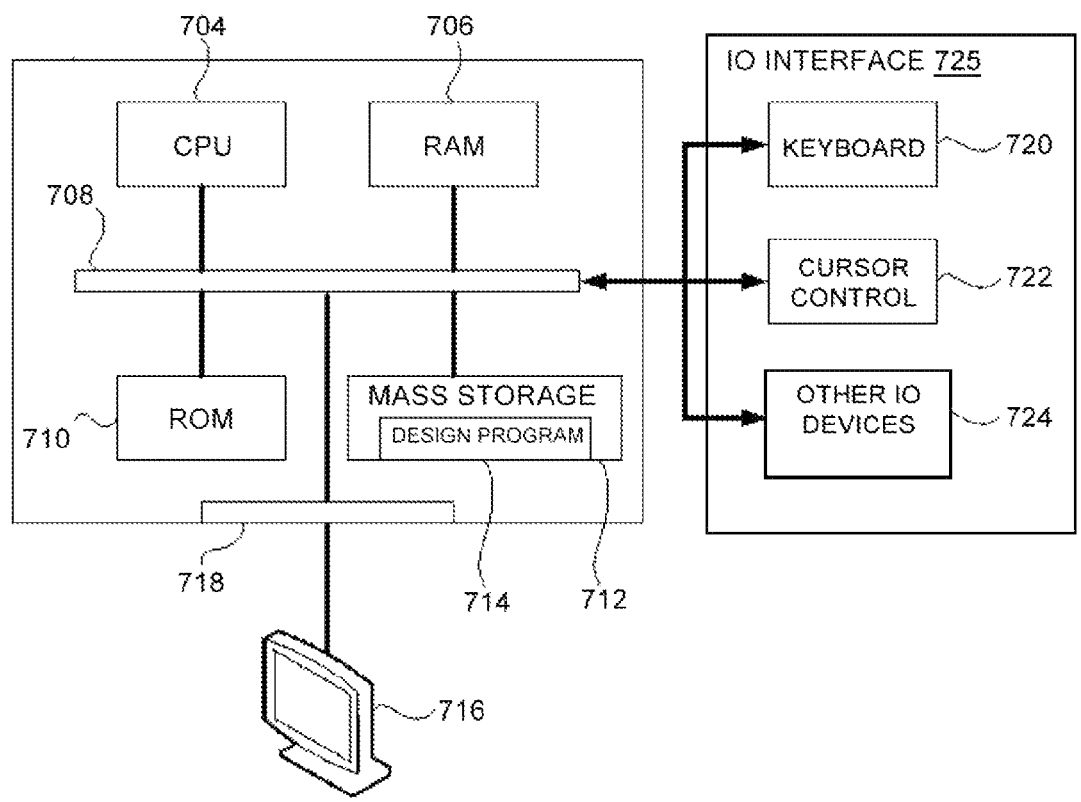
FIG. 7 depicts an illustrative schematic diagram of a computer system for implementing embodiments of the present invention.

FIG. 7 is a simplified schematic diagram of a computer system for implementing embodiments of the present invention. It should be appreciated that the methods described herein may be performed with a digital processing system, such as a conventional, general-purpose computer system. Special-purpose computers, which are designed or programmed to perform one function may be used in the alternative. Accordingly, the computer system of FIG. 7 may be used to design an IC. The computer system includes a central processing unit (CPU) 704, input-output interface 725 and display element 716. It should be appreciated that CPU 704 may be embodied in a general-purpose processor, a special-purpose processor, or a specially programmed logic device.

Referring still to FIG. 7, CPU 704 is coupled through bus 708 to random access memory (RAM) 706, read-only memory (ROM) 710, and mass storage device 712. Mass storage device 712 represents a persistent data storage device such as a fixed disc drive, or a flash-based drive, which may be local or remote. Design program 714 (e.g., an EDA tool that can perform any or all of the operations illustrated in FIGS. 2-5) resides in mass storage device 712, but can also reside in RAM 706 during processing. Display 716 is in communication with CPU 704, RAM 706, ROM 710, and mass storage device 712, through bus 718. Display 716 may also include touch sensors that may be used to receive inputs from a user. Input-output interface 725 includes keyboard 720, cursor control 722, and other input-output devices 724 (e.g., a Joint Test Action Group (JTAG) port, a peripheral component interconnect express (PCIe) slot, etc.) that may be supported by the computer system in FIG. 7. Input-output interface 725 is coupled to bus 708 to communicate with CPU 704. It should be appreciated that data to and from external devices (not shown) may be communicated through input-output interface 725.

Any or all of the steps described above with reference to FIGS. 2-5 may be embodied as machine-readable instructions on a non-transitory machine-readable storage medium. The non-transitory machine-readable storage medium may be any data storage device that can store data, which can thereafter be read by a machine or a computer system (e.g., the computer system shown in FIG. 7). Illustrative examples of such a medium include flash drives, hard drives, network attached storage (NAS), read-only memory, CDs, DVDs, USB drives, volatile and non-volatile memory, and other optical and non-optical data storage devices.

The embodiments, thus far, were described with respect to programmable logic circuits. The method and apparatus described herein may be incorporated into any suitable circuit. For example, the method and apparatus may also be incorporated into numerous types of devices such as microprocessors or other ICs. Exemplary ICs include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

The foregoing is merely illustrative of the principles of this invention and various modifications can be made by those skilled in the art without departing from the scope and spirit of the invention.

What is claimed is:

1. A method of compiling an integrated circuit design for a selected integrated circuit device with an electronic design automation (EDA) tool, comprising:
   determining whether the integrated circuit design is compatible with a predefined design rule;
   in response to determining that the integrated circuit design is incompatible with the predefined design rule, identifying the predefined design rule as an incompatibility factor that indicates that the integrated circuit design is incompatible with the selected integrated circuit device;
   in response to identifying the incompatibility factor, compiling the integrated circuit design based on a simulated removal of the incompatibility factor while the integrated circuit design remains unmodified; and
   generating an output based at least on the simulated removal of the incompatibility factor.

2. The method defined in claim 1, wherein the integrated circuit design is adapted for a targeted integrated circuit device that is different from the selected integrated circuit device, the method further comprising:
   migrating the integrated circuit design from the targeted integrated circuit device to the selected integrated circuit device prior to determining whether the integrated circuit design is compatible with the predefined design rule, wherein the predefined design rule is associated with the targeted integrated circuit device.

3. The method defined in claim 2, wherein generating the output comprises:
   generating a performance report for the integrated circuit design based on migration to the selected integrated circuit device.

4. The method defined in claim 1 further comprising:
   identifying an optimization opportunity for the integrated circuit design; and
   in response to identifying the optimization opportunity, modifying the integrated circuit design based on the identified optimization opportunity.

5. The method defined in claim 4 further comprising:
   generating a performance analysis report for the selected integrated circuit device based on the modified integrated circuit design.

6. The method defined in claim 4, wherein identifying the optimization opportunity comprises:
   identifying a maximum clock speed for the integrated circuit design, wherein modifying the integrated circuit design comprises updating the integrated circuit design to operate at the maximum clock speed.

7. The method defined in claim 4, wherein modifying the integrated circuit design comprises:
   performing a simulated addition of at least one pipeline register stage to the integrated circuit design.

8. The method defined in claim 1 wherein generating the output comprises:
   displaying the incompatibility factor in an output format selected from the group consisting of a text file, a graphical user interface (GUI), and a text-based interface.

9. A method for analyzing an integrated circuit design for a selected integrated circuit device with an electronic design automation (EDA) tool, comprising:
   identifying at least one optimization opportunity in the integrated circuit design;
   identifying an incompatibility factor between the integrated circuit design and a plurality of predefined design rules;
   in response to identifying the at least one optimization opportunity, compiling the integrated circuit design based on an optimized version of the integrated circuit design and on a simulated removal of the incompatibility factor while the integrated circuit design remains unchanged; and
   generating a performance analysis output for the selected integrated circuit device based at least on the optimized version of the integrated circuit design and on the simulated removal of the incompatibility factor.

10. The method defined in claim 9 further comprising:
    initially compiling the integrated circuit design for a targeted integrated circuit device that is different than the selected integrated circuit device; and
    generating an additional performance analysis output for the targeted integrated circuit device based on the integrated circuit design.

11. The method defined in claim 10 further comprising:
    prior to identifying at least one optimization opportunity in the integrated circuit design, migrating the integrated design from the targeted integrated circuit device to the selected integrated circuit device, wherein the plurality of predefined rules is associated with the targeted integrated circuit device.

12. The method defined in claim 9 further comprising:
    displaying the at least one optimization opportunity in an output format selected from the group consisting of a text file, a graphical user interface (GUI), and a text-based interface.

13. A method for analyzing an integrated circuit design with an electronic design automation (EDA) tool comprising:
- identifying an incompatibility factor between the integrated circuit design and a selected integrated circuit device, wherein the integrated circuit design is adapted for a target integrated circuit device that is different from the selected integrated circuit device; and
- in response to identifying the incompatibility factor, compiling the integrated circuit design for the selected integrated circuit device based at least on a simulated removal of the incompatibility factor.

14. The method defined in claim 13, the method further comprising:
- migrating the integrated circuit design to the selected integrated circuit device prior to identifying the incompatibility factor; and
- listing the incompatibility factor in an output file.

15. The method defined in claim 14 further comprising:
- identifying an optimization opportunity in the migrated integrated circuit design; and
- compiling the migrated integrated circuit design for the selected integrated circuit device based on a simulated optimization change in the integrated circuit design.

16. The method defined in claim 15 further comprising:
- compiling the integrated circuit design for the target integrated circuit device to obtain a first performance analysis output for the target integrated circuit device; and
- generating a second performance analysis output for the selected integrated circuit device based on the simulated optimization change in the integrated circuit design.

17. The method defined in claim 16 further comprising:
- comparing the first performance analysis output with the second performance analysis output; and
- in response to the comparison, recording a performance gain from one of the target and selected integrated circuit devices.

18. The method defined in claim 13, wherein the integrated circuit design comprises a plurality of required logic resources and the selected integrated circuit device comprises a plurality of available logic resources, and wherein identifying the incompatibility factor in the integrated circuit design comprises:
- determining whether the plurality of available logic resources includes the plurality of required logic resources; and
- in response to determining that the plurality of available logic resources does not include the plurality of required logic resources, identifying a required logic resource in the plurality of required logic resources that is not included in the plurality of available logic resources as an incompatible logic resource, wherein the simulated removal of the incompatibility factor comprises a simulated removal of the incompatible logic resource from the integrated circuit design.

\* \* \* \* \*